United States Patent
Kasahara et al.

(10) Patent No.: US 10,811,268 B2
(45) Date of Patent: Oct. 20, 2020

(54) SUBSTRATE PROCESSING APPARATUS, SUBSTRATE PROCESSING METHOD, AND SEMICONDUCTOR DEVICE FABRICATION METHOD

(71) Applicant: TOSHIBA MEMORY CORPORATION, Tokyo (JP)

(72) Inventors: Yusuke Kasahara, Yokohama Kanagawa (JP); Shinichi Ito, Yokkaichi Mie (JP); Seiji Morita, Shinagawa Tokyo (JP); Ryosuke Yamamoto, Kawasaki Kanagawa (JP); Ryuichi Saito, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/101,964

(22) Filed: Aug. 13, 2018

(65) Prior Publication Data

US 2019/0287809 A1 Sep. 19, 2019

(30) Foreign Application Priority Data

Mar. 16, 2018 (JP) .................................. 2018-049952

(51) Int. Cl.
*H01L 21/3065* (2006.01)
*H01L 21/027* (2006.01)
*H01L 21/308* (2006.01)

(52) U.S. Cl.
CPC ...... *H01L 21/3065* (2013.01); *H01L 21/0273* (2013.01); *H01L 21/3081* (2013.01); *H01L 21/3086* (2013.01)

(58) Field of Classification Search
CPC .......... H01L 21/31144; H01L 21/0337; H01L 21/3081; H01L 21/3065; H01L 21/3086; H01L 21/0273; H01L 21/02315
USPC ......................... 438/717, 722, 725, 736, 742
See application file for complete search history.

(56) References Cited

U.S. PATENT DOCUMENTS

| | | | |
|---|---|---|---|
| 7,371,692 B2 | 5/2008 | Kofuji | |
| 8,980,418 B2 | 3/2015 | Darling et al. | |
| 9,257,299 B2 | 2/2016 | Aoyama | |
| 9,411,237 B2 | 8/2016 | Xie et al. | |
| 9,684,234 B2 | 6/2017 | Darling et al. | |
| 9,786,511 B2 | 10/2017 | Darling et al. | |
| 2014/0091319 A1* | 4/2014 | Yamada | H01L 29/42372 257/76 |
| 2017/0343896 A1* | 11/2017 | Darling | G03F 7/0002 |

(Continued)

FOREIGN PATENT DOCUMENTS

| | | |
|---|---|---|
| JP | H03-174724 A | 7/1991 |
| JP | H08-031720 A | 2/1996 |
| JP | 2012-204456 A | 10/2012 |

*Primary Examiner* — Binh X Tran
(74) *Attorney, Agent, or Firm* — Kim & Stewart LLP

(57) ABSTRACT

According to one embodiment, a substrate processing apparatus comprises a chamber for a substrate that has a target film thereon. The apparatus includes a first gas introducing unit to introduce a precursor gas into the chamber, a second gas introducing unit that introduces a etching gas for etching the target film into the chamber, and a controller configured to control the first gas introducing unit and the second gas introducing unit to cause the first gas and the second gas to be alternately introduced to the chamber.

12 Claims, 12 Drawing Sheets

(56) References Cited

U.S. PATENT DOCUMENTS

2017/0352550 A1* 12/2017 Tois ................. H01L 21/02178
2018/0122648 A1* 5/2018 Kim ................... H01L 21/3086

* cited by examiner

SUBSTRATE PROCESSING APPARATUS, SUBSTRATE PROCESSING METHOD, AND SEMICONDUCTOR DEVICE FABRICATION METHOD

CROSS-REFERENCE TO RELATED APPLICATION

This application is based upon and claims the benefit of priority from Japanese Patent Application No. 2018-049952, filed Mar. 16, 2018, the entire contents of which are incorporated herein by reference.

FIELD

Embodiments described herein relate generally to a substrate processing apparatus, a substrate processing method, and a semiconductor device fabrication method.

BACKGROUND

In some processes target film on substrate maybe etched using an organic film disposed on the target film as an etching mask. It has been shown that an organic film infiltrated with a metallic element or other non-organic element can have an improved etching resistance in some instances.

DETAILED DESCRIPTION

When using a target film having a large thickness, a relatively thick organic film mask may be necessary depending on the intended processing of the target film. When using a thick organic film, a metallic or other non-organic element may not diffuse sufficiently to the bottom of the organic film, and thus infiltration of the metallic or other non-organic element into the organic film may not be sufficient to prevent an etching failure.

In general, according to one embodiment, a substrate processing apparatus comprises a chamber for a substrate that has a target film thereon. The apparatus includes a first gas introducing unit to introduce a first gas into the chamber, a second gas introducing unit that introduces a second gas for etching the target film into the chamber, and a controller configured to control the first gas introducing unit and the second gas introducing unit to cause the first gas and the second gas to be alternately introduced to the chamber. The first gas includes a metallic element or a semiconductor element.

Hereinafter, example embodiments of the present disclosure will be described with reference to the drawings. These example embodiments are not intended to limit the present disclosure.

First Embodiment

Figure 1:
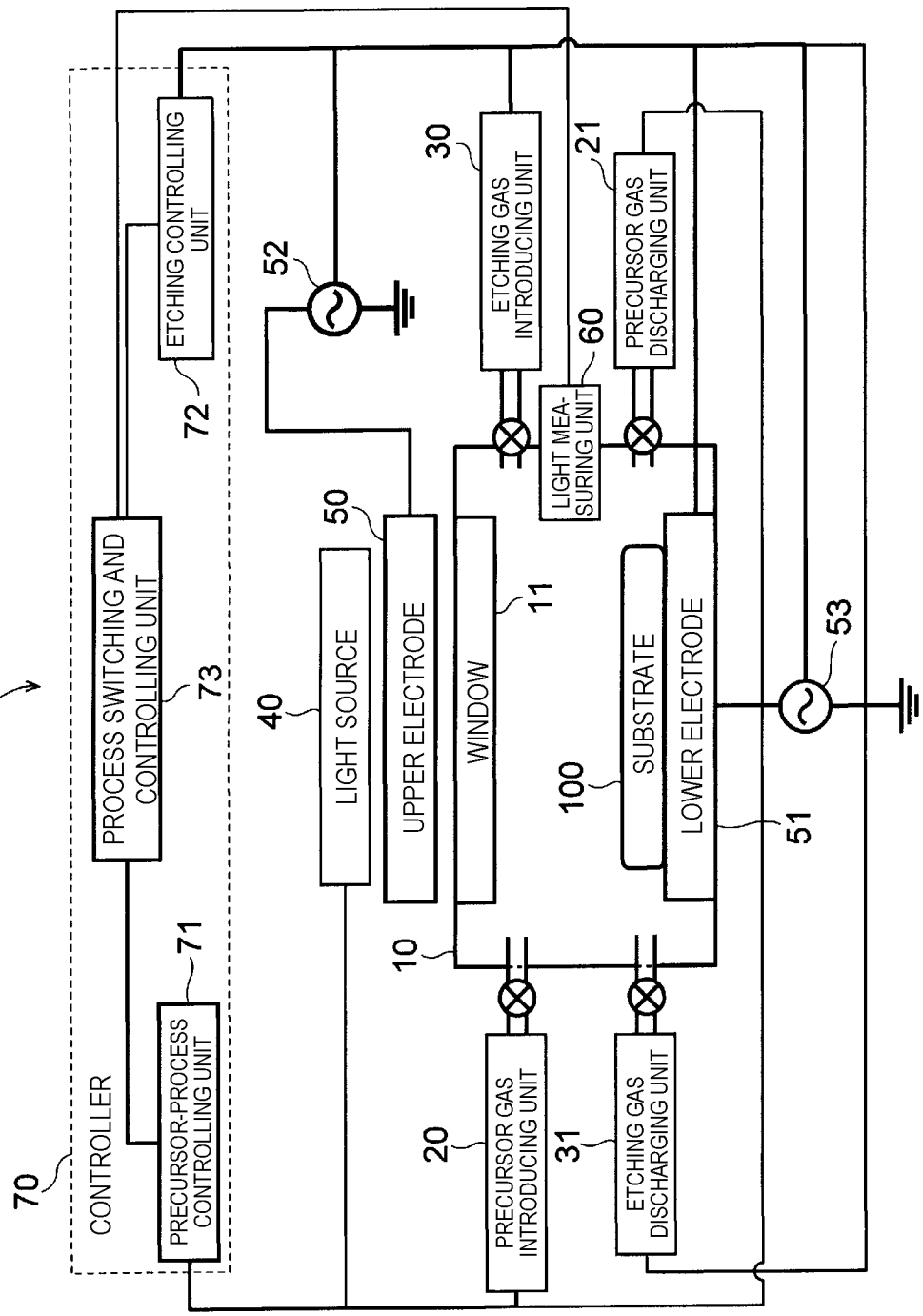
FIG. 1 is a block diagram illustrating aspects of a substrate processing apparatus according to a first embodiment.

FIG. 1 is a schematic view illustrating aspects of a configuration of a substrate processing apparatus of a first embodiment. FIG. 1 illustrates a substrate processing apparatus 1 that can, for example, be used as a production apparatus of a semiconductor memory device or the like. The substrate processing apparatus 1 includes a chamber 10, a precursor gas introducing unit 20, a precursor gas discharging unit 21, an etching gas introducing unit 30, an etching gas discharging unit 31, a light source 40, an upper electrode 50, a lower electrode 51, high frequency power sources 52 and 53, a light measuring unit 60, and a controller 70.

The chamber 10 is configured to accommodate a substrate 100. The substrate 100 has a target film and an organic film formed thereon. Details of the target film and the organic film are described later. The chamber 10 has a window 11 that is provided at an upper part of the chamber 10. Light from the light source 40 reaches the substrate 100 by passing through the window 11.

The precursor gas introducing unit 20 introduces a precursor gas containing a metallic element or a semiconductor precursor element, into the chamber 10. The precursor gas introducing unit 20 may comprise a flow controller or the like in some examples. Examples of the metallic element include aluminum (Al), titanium (Ti), hafnium (Hf), indium (In), tungsten (W), tantalum (Ta), ruthenium (Ru), and zirconium (Zr), and combinations of these elements can be contained in the precursor gas. A semiconductor element may be, for example, silicon (Si) or germanium (Ge). These elements in the precursor gas infiltrate into the organic film formed on the substrate 100. The precursor gas maybe referred to as a first gas in some contexts.

The precursor gas discharging unit 21 discharges or otherwise evacuates the precursor gas from the chamber 10. In this first embodiment, the precursor gas discharging unit 21 is disposed at a side surface of the chamber 10, which is opposite to the side on which the precursor gas introducing unit 20 is provided.

The etching gas introducing unit 30 introduces an etching gas (an etchant) into the chamber 10. The etching gas introducing unit 30 may comprise a flow controller or the like in some examples. The etching gas etches the target film formed on the substrate 100.

The etching gas discharging unit 31 discharges the etching gas from the chamber 10. The etching gas may be a gas containing fluorocarbon or halogen or both, but the kind of the etching gas is not particularly limited. In this first embodiment, the etching gas discharging unit 31 is disposed at a side surface of the chamber 10, which is opposite to the side on which the etching gas introducing unit 30 is provided. That is, the etching gas discharging unit 31 is disposed at the same side surface as the precursor gas introducing unit 20. The etching gas may be referred to as a second gas in some contexts.

The light source 40 is disposed above the window 11 of the chamber 11. The light source 40 emits light to the substrate 100 through the window 11. This light heats the substrate 100.

The upper electrode 50, the lower electrode 51, and the high frequency power sources 52 and 53 constitute a capacitively coupled plasma (CCP) generator. The upper electrode 50 is disposed between the window 11 of the chamber 10 and the light source 40. The lower electrode 51 faces the upper electrode 50. The lower electrode 51 receives the substrate 100 thereon. The high frequency power source 52 is connected to the upper electrode 50, whereas the high frequency power source 53 is connected to the lower electrode 51. The high frequency power sources 52 and 53 make a high-frequency electric field between the upper electrode 50 and the lower electrode 51 to generate plasma in the chamber 10. As a result, the etching gas introduced from the etching gas introducing unit 30 is changed into plasma. The plasma etching gas etches the target film on the substrate 100.

The light measuring unit 60 separates the light from the chamber 10 resulting from the generated plasma to measure the intensity of the light at several wavelengths (obtain an output spectrum). Further, the light measuring unit 60 outputs the measurement result to the controller 70.

The controller 70 has a precursor-process controlling unit 71, an etching controlling unit 72, and a process switching and controlling unit 73. The precursor-process controlling unit 71 controls the precursor gas introducing unit 20, the precursor gas discharging unit 21, and the light source 40. The etching controlling unit 72 controls the etching gas introducing unit 30 and the etching gas discharging unit 31. The process switching and controlling unit 73 controls the precursor-process controlling unit 71 and the etching controlling unit 72 in response to the measurement result from the light measuring unit 60.

Hereinafter, a semiconductor device fabrication method according to this first embodiment will be described with reference to FIGS. 2 to 7.

Figure 2:
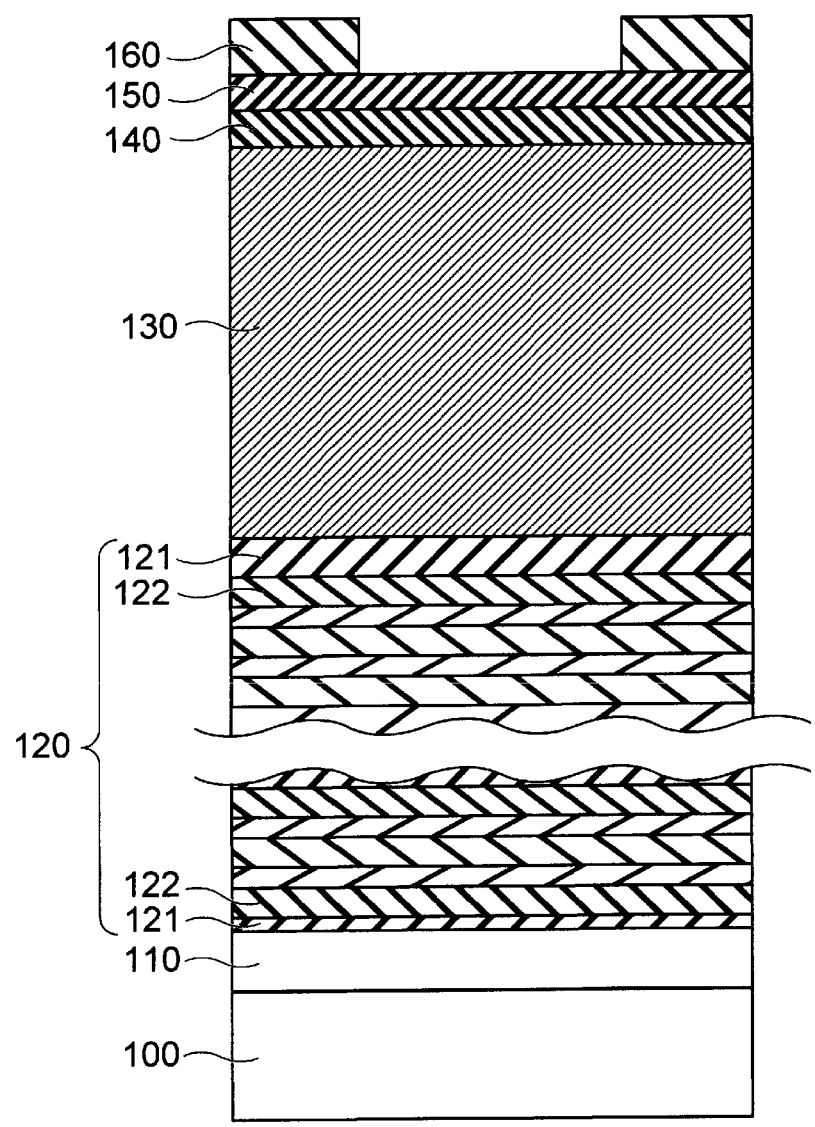
FIG. 2 is a cross sectional view illustrating a deposition process of a substrate.

First, as illustrated in FIG. 2, a stopper film 110, a target film 120, an organic film 130, a cover film 140, an antireflection film 150, and a resist film 160 are successively stacked in order from the substrate 100.

The substrate 100 is, for example, a semiconductor substrate containing silicon and dopants. The stopper film 110 is, for example, an amorphous silicon (a-Si) film.

The target film 120 is a stacked film of alternately stacked pairs of an insulating layer 121 and an insulating layer 122. The insulating layer 121 is, for example, a silicon oxide layer with a thickness of 30 nm. The insulating layer 122 is, for example, a silicon nitride layer with a thickness of 50 nm. In this embodiment, the number of each of the insulating layers is 48, but this number is not particularly limited. The target film 120 need not be formed on a stopper film 110, but instead, the target film 120 may be directly formed on the substrate 100.

The organic film 130 is formed by spin coating, for example. The organic film 130 is a film containing carbon, for example, a polymethylmethacrylate (PMMA) film with a thickness of 1000 nm.

The cover film 140 is formed by spin coating, for example. The cover film 140 is, for example, a spin-on glass (SOG) film with a thickness of 100 nm.

The antireflection film 150 has a thickness of 60 nm, for example. The antireflection film 150 formed on the upper side of the organic film 130 eliminates the need to provide an antireflection function in the organic film 130 itself. This allows freer selection of the material(s) of the organic film 130. For example, a material facilitating infiltration (diffusion) of the metallic element or the semiconductor precursor can be selected for the organic film 130.

The resist film 160 is subjected to photopatterning using an ArF (argon fluorine excimer) liquid immersion type exposure device, for example.

Figure 3:
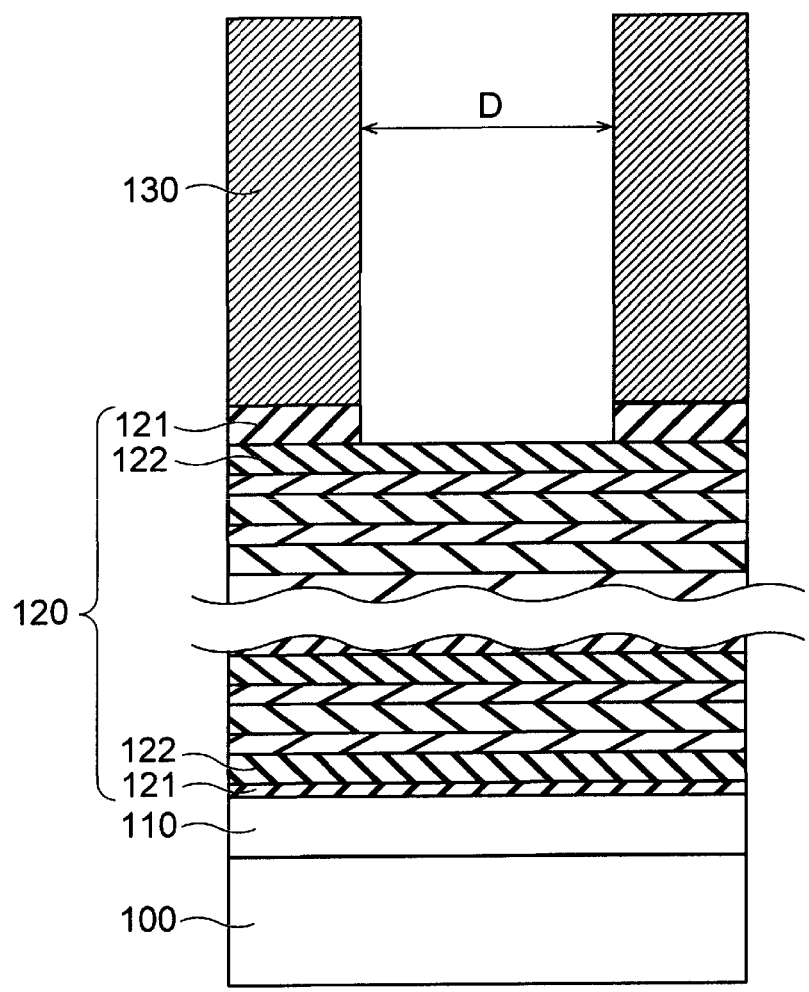
FIG. 3 is a cross sectional view illustrating a patterning process of an organic film.

Next, the antireflection film 150 and the cover film 140 are etched by reactive ion etching (RIE) using the patterned resist film 160 as a mask. The organic film 130 is etched by RIE using the cover film 140 as a mask. Thereafter, RIE is performed until the cover film 140 is removed. At this time, the uppermost insulating layer 121 is etched. As a result, as illustrated in FIG. 3, the organic film 130 is patterned so as to have an opening diameter D. Then, the substrate 100 is carried into the chamber 10 of the substrate processing apparatus 1.

A precursor process is first performed in the chamber 10. Specifically, the precursor gas introducing unit 20 introduces a trimethylaluminum (TMA) gas as a precursor gas, into the chamber 10 for approximately 5 minutes in accordance with the control of the precursor-process controlling unit 71. The TMA gas contains aluminum as a metallic element. Meanwhile, the light source 40 emits light in accordance with the control of the precursor-process controlling unit 71, and the substrate 100 is heated to approximately 100° C. The pressure in the chamber 10 is adjusted to be approximately 300 Pa by the precursor gas introducing unit 20.

At this time, the precursor gas discharging unit 21 discharges the precursor gas from the chamber 10 in accordance with the control of the precursor-process controlling unit 71. Then, water vapor is introduced into the chamber 10. At this time, the pressure in the chamber 10 is reduced to be approximately 250 Pa. The water ($H_2O$) and TMA react with each other and produce aluminum oxide, and aluminum oxide diffuses from the upper surface and the side surface of the organic film 130, that is, from the surfaces of the organic film 130 exposed in the chamber 10. Aluminum oxide diffuses from the upper surface and the side surface of the organic film 130 for some distance and the concentration of diffusant may vary along this distance. In the region infiltrated with aluminum oxide, the organic film 130 swells and an upper end diameter of the opening in the organic film 130 is narrowed by approximately 20%. The upper end opening diameter of the organic film 130 is represented as 0.8 D relative to the original opening diameter D.

Figure 4:
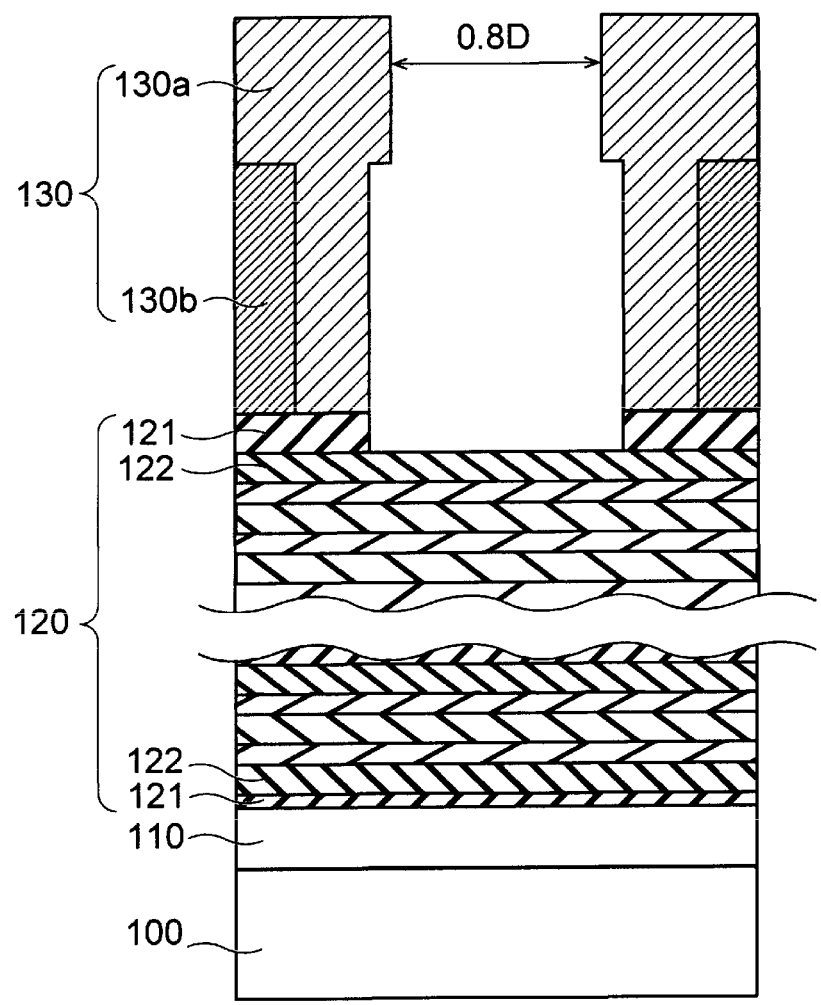
FIG. 4 is a cross sectional view illustrating a precursor processing process.

In this embodiment, the organic film 130 is made thick because of the thick target film 120. Thus, as illustrated in FIG. 4, a metal-containing region 130a containing aluminum at approximately 15 to 20% concentration and a non-metal-containing region 130b containing aluminum at approximately 0% concentration are generated in the organic film 130. The metal-containing region 130a has a high etching resistance compared with the non-metal-containing region 130b.

Figure 5:
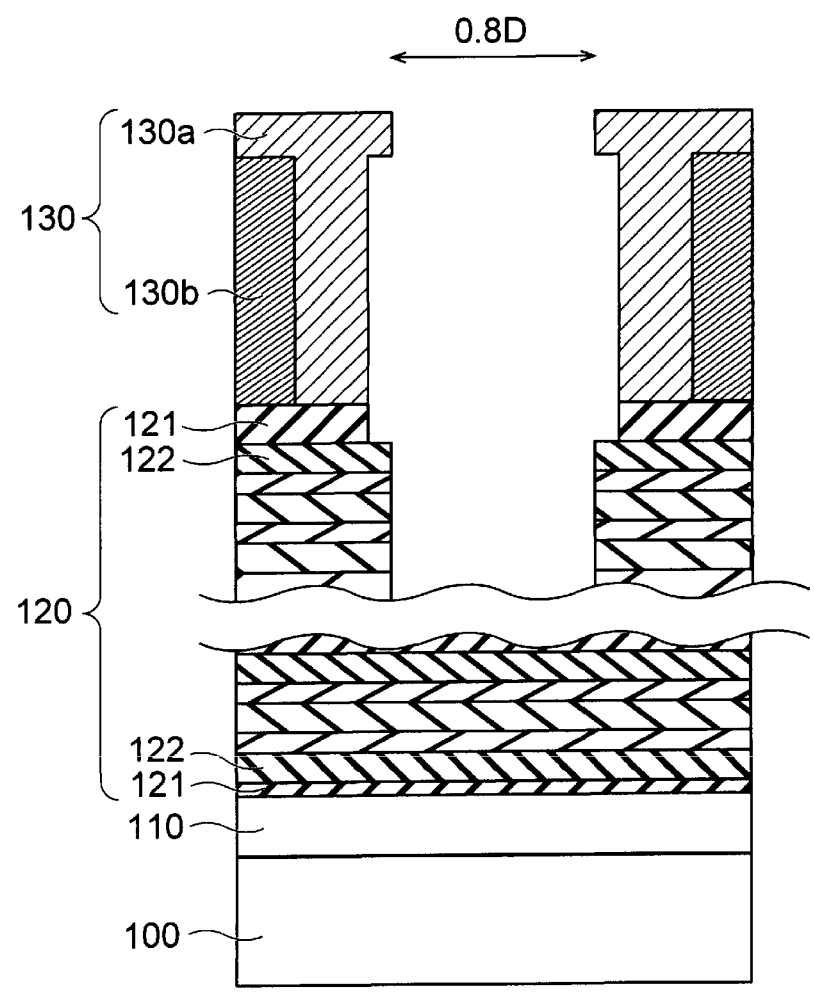
FIG. 5 is a cross sectional view illustrating an etching process of a target film.

Next, the target film 120 is etched. Specifically, the etching gas introducing unit 30 introduces the etching gas into the chamber 10 in accordance with the control of the etching controlling unit 72. Meanwhile, the etching controlling unit 72 also controls the high frequency power sources 52 and 53 so that they will make a high frequency electric field between the upper electrode 50 and the lower electrode 51 to generate plasma in the chamber 10. As a result, as illustrated in FIG. 5, etching of the target film 120 is started with the pattern of the organic film 130 being used as a mask.

While the target film 120 is etched, the light measuring unit 60 measures light emitted from the plasma in the chamber 10 and outputs the measurement result to the process switching and controlling unit 73. In this embodiment, since the organic film 130 contains aluminum, the light measuring unit 60 monitors light with a wavelength corresponding to an emission from an excited aluminum atom. The light measuring unit 60 is light sensor that measures light having a wavelength of 309 nm or 394 nm, for example.

Figure 6:
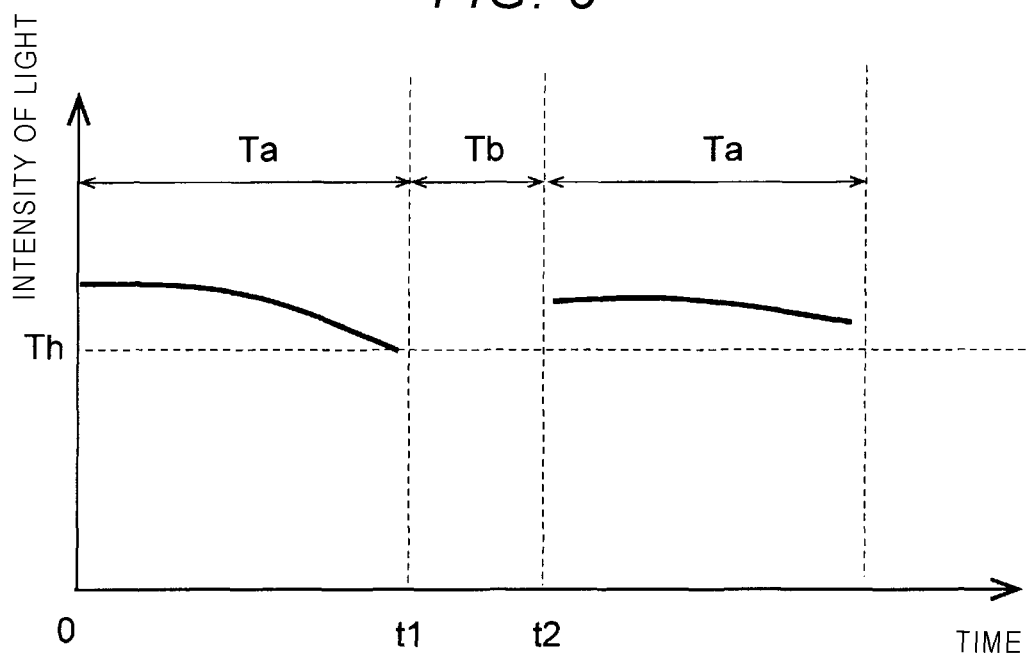
FIG. 6 is a graph showing an example of temporal variation in intensity of light as measured by a light measuring unit.

FIG. 6 is a graph showing an example of temporal variation in the intensity of the light that is measured by the light measuring unit 60. The horizontal axis represents time, whereas the vertical axis represents the intensity of the light measured by the light measuring unit 60. In other words, the vertical axis corresponds to an aluminum amount per unit area of the organic film 130.

As the etching of the target film 120 advances, the thickness of the metal-containing region 130a of the organic film 130 in a direction perpendicular to the substrate 100 decreases. The amount of aluminum also decreases, and thus, the intensity of the relevant light emissions decreases gradually. Then, when the intensity of the light decreases to a predetermined threshold Th, the process switching and controlling unit 73 causes the etching controlling unit 72 to pause etching of the target film 120. In response to this, the etching gas introducing unit 30 stops introduction of the etching gas, and the etching gas discharging unit 31 discharges the etching gas from the chamber 10. In this embodiment, the threshold Th is set so as to correspond to a time t1 at which the etched amount of the organic film 130 is, for example, 400 nm. In this condition, the concentration of aluminum in the metal-containing region 130a is approximately 15%.

Any etching of the target film 120 after the time t1 might cause the non-metal-containing region 130b to be exposed. The non-metal-containing region 130b has an etching resistance lower than the etching resistance of the metal-containing region 130a. Thus, continued etching in the condition would preferentially remove the non-metal-containing region 130b and can cause processing failure of the target film 120.

Figure 7:
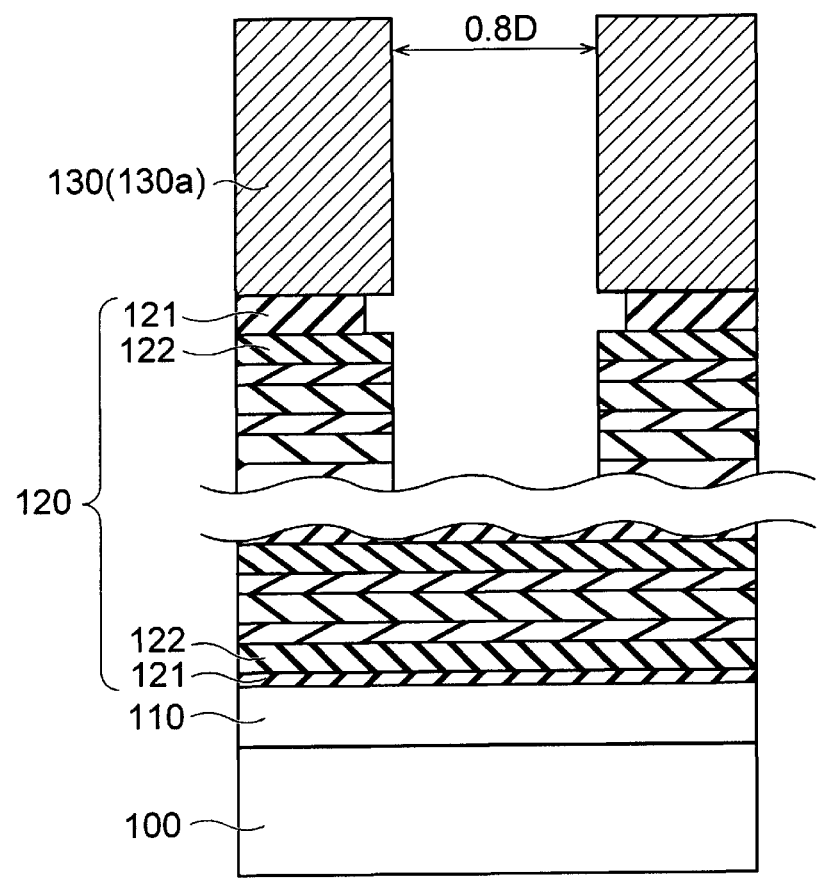
FIG. 7 is a cross sectional view illustrating a precursor processing process after the etching process.

For this reason, after an etching time Ta has passed, a process similar to the initial precursor process is started. Thus, aluminum again infiltrates into the non-metal-containing region 130b and thereby makes the additional portions (or the entirety) of the remaining organic film 130 become a metal-containing region 130a, as illustrated in FIG. 7. For example, the concentration of aluminum is approximately 20% at the upper part and is approximately 15% at the bottom.

Figure 8:
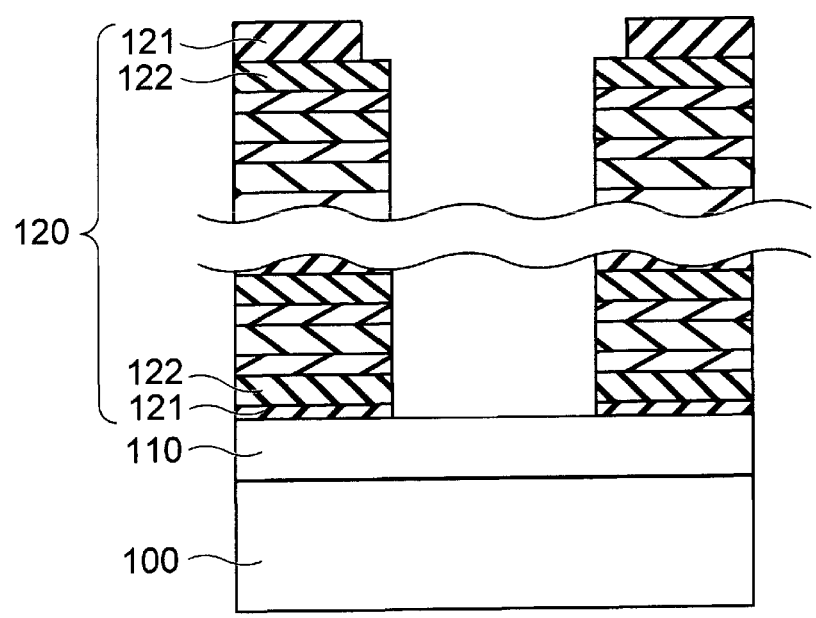
FIG. 8 is a cross sectional view illustrating a patterning process of a target film.

After the precursor process time Tb has passed, etching of the target film 120 is performed by using the metal-infiltrated organic film 130 as a mask again, in a similar manner as described above. Finally, an ashing process and a wet etching process are performed to remove the remaining or residual organic film 130. As a result, the target film 120 is patterned as illustrated in FIG. 8. A precursor process is performed twice in this embodiment. After the second precursor process is performed, etching is performed while the intensity of the light is measured by the above-described method. If the intensity of the light reaches the threshold Th, a third precursor process could be performed, and then, etching is restarted. That is, the number of precursor processes and the etching stages is not particularly limited.

According to this process, metal sufficiently infiltrates into the organic film 130 and ultimately reaches the bottom of the organic film 130 even when the organic film 130 has a large initial thickness. Thus, the etching result is improved.

In this embodiment, the precursor process and the etching are performed in the same chamber 10. This enables the precursor process and the etching to be successively performed without removing the substrate 100 from the chamber 10. Accordingly, throughput is improved.

The process changing and controlling unit 73 may alternately switch the precursor process and the etching in accordance with pre-determined, fixed times Ta and Tb, as illustrated in FIG. 6, instead in response to the measurement results from the light measuring unit 60. The times Ta and Tb are respectively set in advance for each precursor process and the etching. In this case, the light measuring unit 60 would not be required, and thus, the configuration of the apparatus can be made simpler.

Modification

Figure 9:
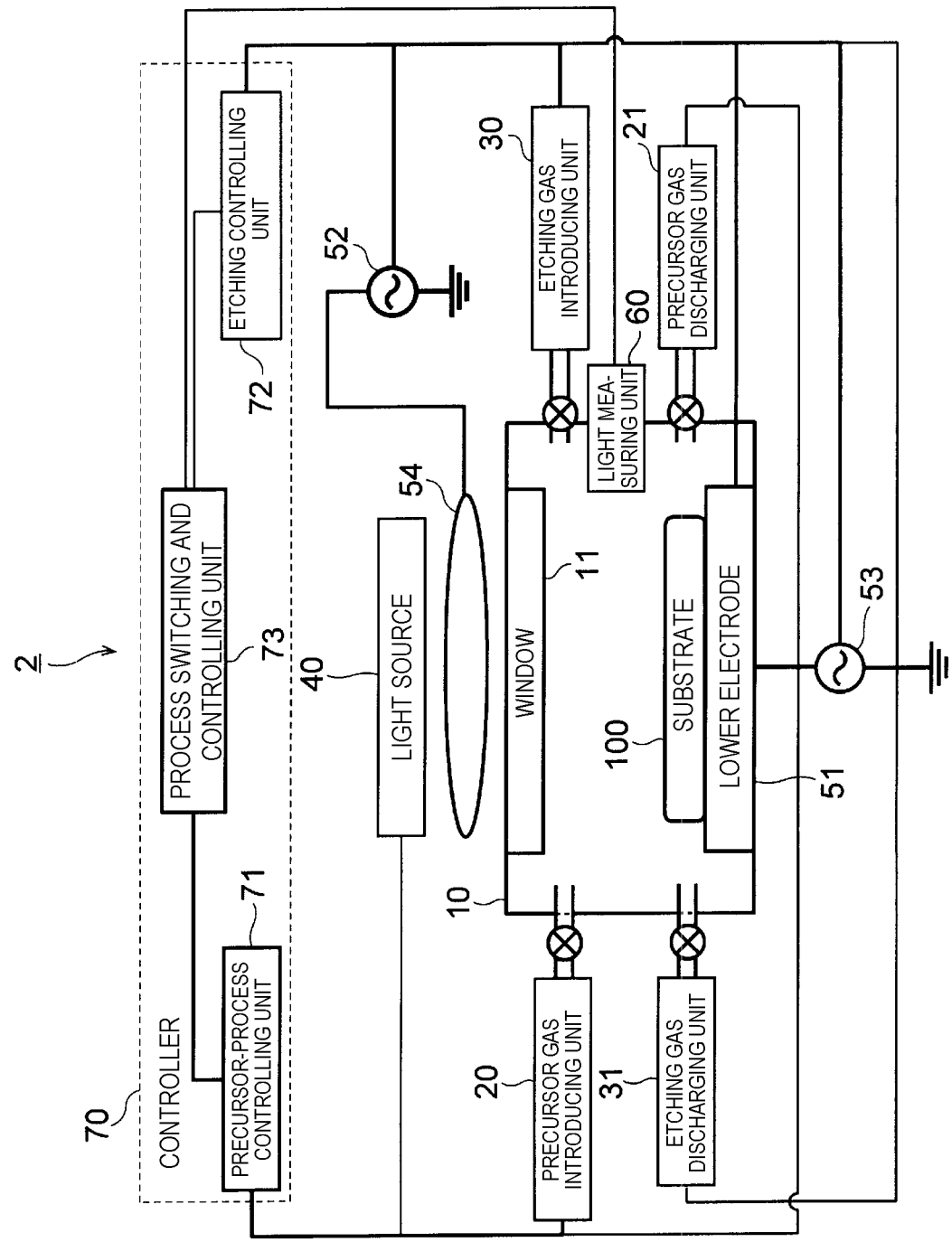
FIG. 9 is a schematic view illustrating aspects of a substrate processing apparatus according to a modification example.

FIG. 9 is a schematic view illustrating an outline of a configuration of a substrate processing apparatus of a modification. The configuration components similar to those of the substrate processing apparatus in FIG. 1 are represented by the same reference symbols, and detailed descriptions for these components are not repeated.

FIG. 9 illustrates a substrate processing apparatus 2 having a high frequency antenna 54 that is provided instead of the upper electrode 50. The high frequency antenna 54 constitutes an inductively coupled plasma (ICP) generator in conjunction with the lower electrode 51 and the high frequency power sources 52 and 53.

In this modification, when the etching gas introducing unit 30 introduces the etching gas, the high frequency power source 52 makes an alternating current flow to the high frequency antenna 54. In response to this, an electromagnetic field is generated in the chamber 10 by electromagnetic induction. This causes generation of plasma in the chamber 10, whereby the target film 120 is etched.

In this modification, the etching of the target film 120 and the precursor process are repeated in a similar manner as in the above embodiment, and therefore, the metal sufficiently infiltrates into the organic film 130. Thus, the etching resistance is improved.

Second Embodiment

This second embodiment uses the substrate processing apparatus 1 in FIG. 1 or the substrate processing apparatus 2 in FIG. 9, and therefore, descriptions for the configuration of the apparatus are not repeated. Hereinafter, a semiconductor device fabrication method according to this second embodiment will be described with reference to FIGS. 10 to 14. Descriptions for the processes similar to those in the first embodiment are not repeated.

Figure 10:
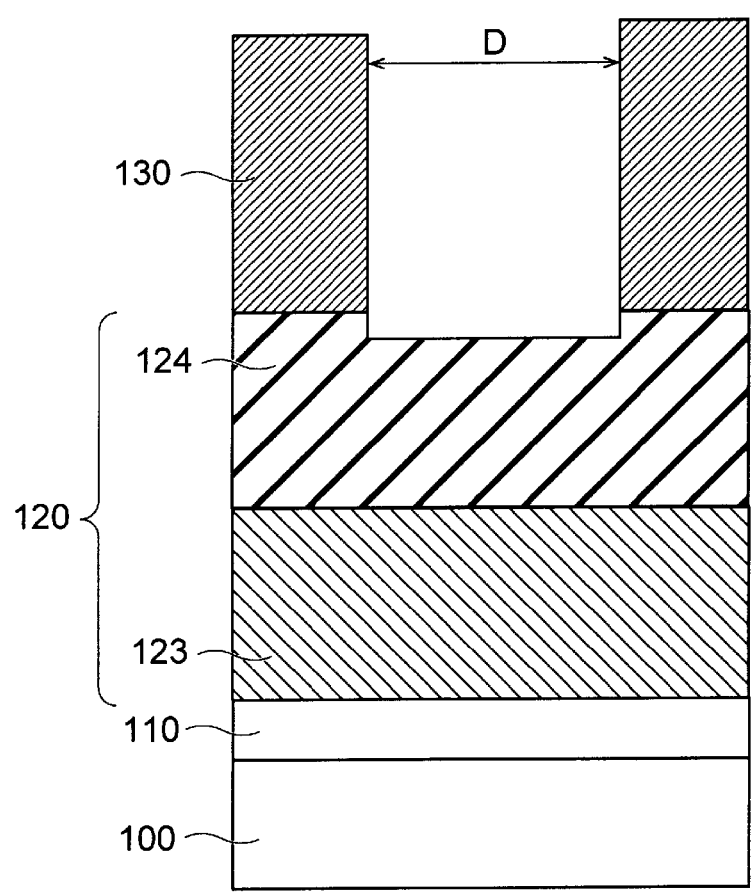
FIG. 10 is a cross sectional view illustrating a patterning process of an organic film according to a second embodiment.

First, as illustrated in FIG. 10, a stopper film 110, a target film 120, and an organic film 130 are successively stacked in this order from the substrate 100.

In this second embodiment, the target film 120 includes a metal film 123 and an insulating film 124. The metal film 123 is formed on the stopper film 110. The insulating film 124 is formed on the metal film 123. The metal film 123 is, for example, a tungsten film. The insulating film 123 is, for example, a silicon oxide film.

The organic film 130 is patterned so as to have an opening diameter D. This pattern is generated in a similar manner as in the first embodiment by using the cover film 140, the antireflection film 150, and the resist film 160 that are formed on the organic film 130. Even after the organic film 130 is patterned, RIE is performed until the cover film 140 has been removed. This causes the upper part of the insulating film 124 to be partially etched. Thereafter, the substrate 100 is carried into the chamber 10 of the substrate processing apparatus 1 or the substrate processing apparatus 2.

A first precursor process is first performed in the chamber 10. In the first precursor process, the precursor gas introducing unit 20 introduces a TMA gas as a first precursor gas into the chamber 10. The aluminum in the first precursor gas infiltrates into the organic film 130 in a similar manner as in the first embodiment.

Figure 11:
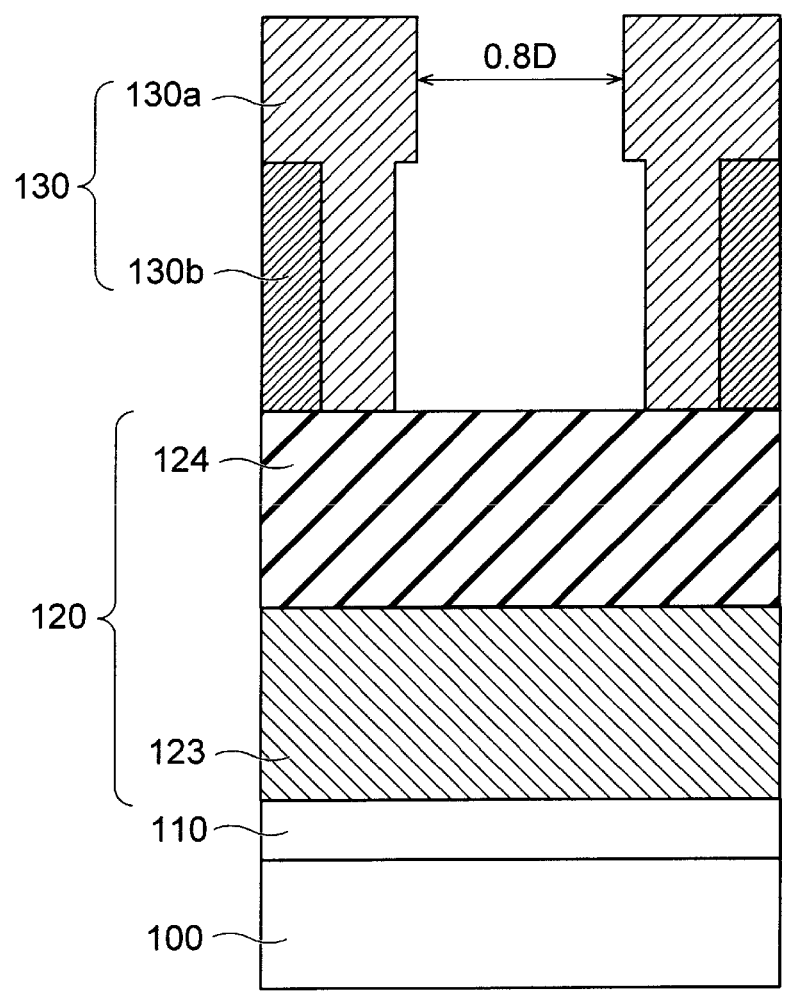
FIG. 11 is a cross sectional view illustrating a first precursor processing process.

In this second embodiment, the organic film 130 has a thickness of 500 nm. Thus, as illustrated in FIG. 11, a metal-containing region 130a and a non-metal-containing region 130b are generated in the organic film 130 in a similar manner as in the first embodiment.

Next, the insulating film 124 is etched. While the insulating film 124 is being etched, the light measuring unit 60 measures the intensity of the light in the chamber 10 and outputs the measurement result to the process switching and controlling unit 73.

Figure 12:
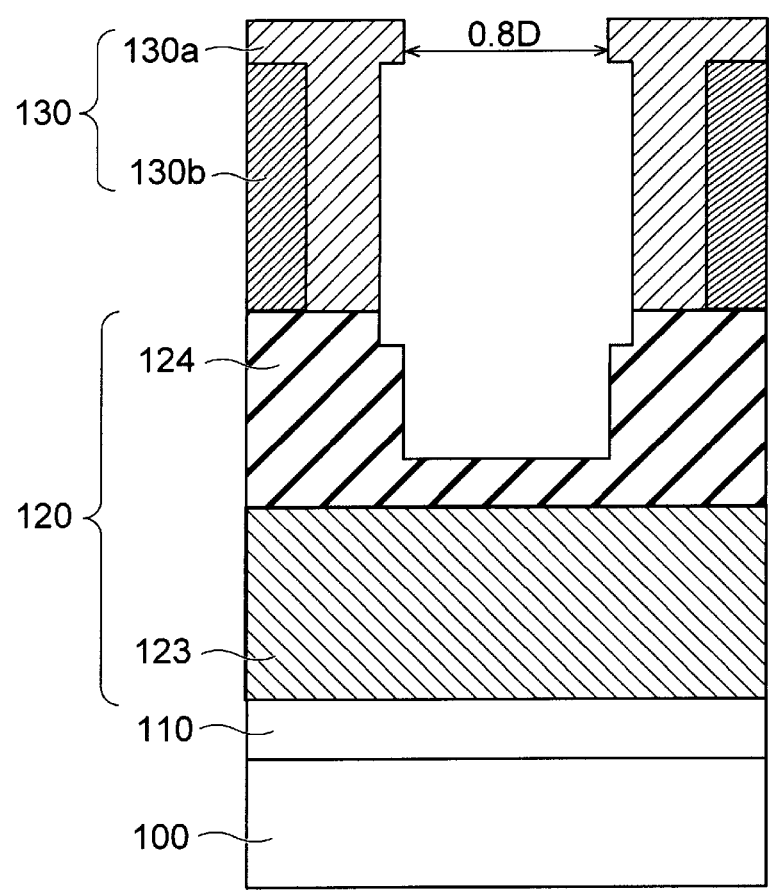
FIG. 12 is a cross sectional view illustrating an etching process of an insulating film.

When the light measuring unit 60 measures an intensity of the light that is decreased to a predetermined threshold Th, the process switching and controlling unit 73 causes the etching controlling unit 72 to pause etching of the insulating film 124. At this time, as illustrated in FIG. 12, the insulating film 124 is not yet penetrated through, but still remains partially.

Figure 13:
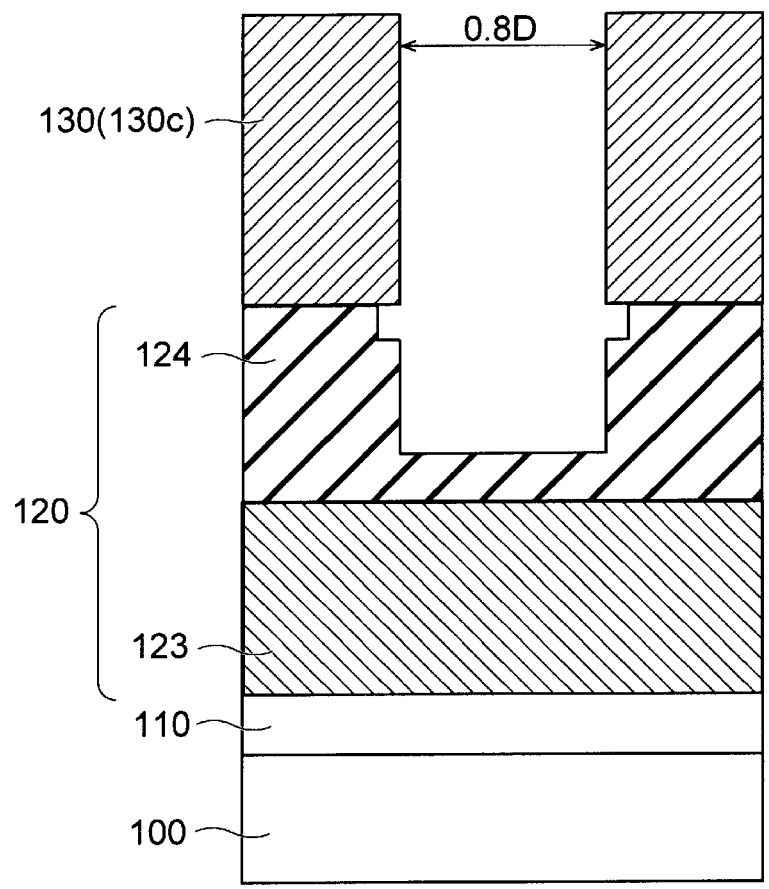
FIG. 13 is a cross sectional view illustrating a second precursor processing process.

Thereafter, a second precursor process is performed. In the second precursor process, the precursor gas introducing unit 20 introduces a second precursor gas into the chamber 10. The second precursor gas contains a metallic element that exhibits a high selection ratio relative to the metal contained in the metal film 123. In this embodiment, a tetrakisdimethylaminotitanium (TDMAT) gas containing titanium as a metallic element is used as the second precursor gas. As a result, as illustrated in FIG. 13, portions or an entirety of the organic film 130 is changed to a metal-containing region 130c. The surface of the metal-containing region 130c contains titanium in an amount greater than the amount of aluminum.

Figure 14:
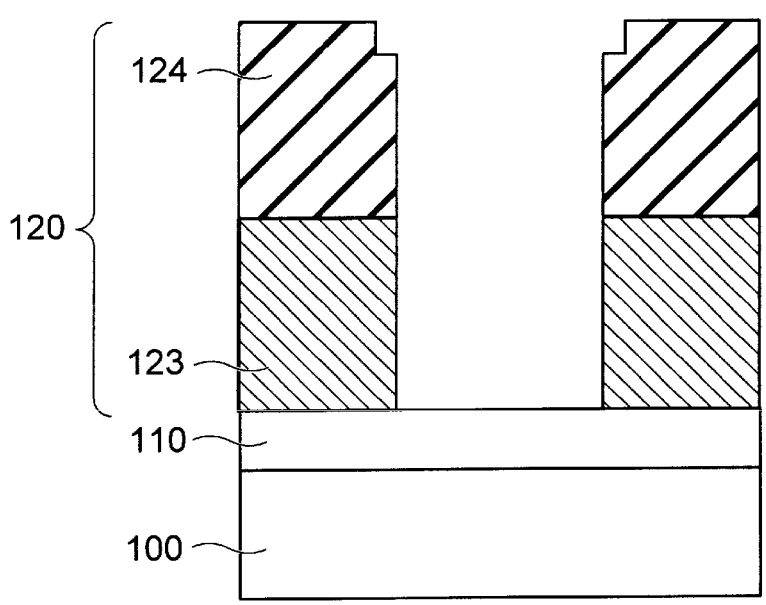
FIG. 14 is a cross sectional view illustrating a patterning process of a target film according to a second embodiment.

After the second precursor process is finished, the remaining insulating film 124 and the metal film 123 are etched by using the organic film 130 as a mask. Finally, an ashing process and a wet etching process are performed to remove the organic film 130. As a result, the target film 120 is patterned as illustrated in FIG. 14.

According to this second embodiment, the metal sufficiently infiltrates into the organic film 130 and reaches the bottom of the organic film 130 even when the organic film 130 has a large thickness, in a similar manner as in the first embodiment. Thus, the etching resistance is improved regardless of the thickness of the target film 120.

In particular, in this second embodiment, metallic elements that differ depending on the materials of the insulating film 124 and the metal film 123 are diffused into the organic film 130 before the insulating film 124 and the metal film 123 are respectively processed. Thus, even though the target film 120 has multiple films made of different materials, the target film 120 is processed by using just one kind of organic film 130 without reducing an etching tolerance amount.

As in the case of the first embodiment, the precursor process and the etching may be switched in accordance with predetermined timings instead of in accordance with the measurement result from the light measuring unit 60.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein maybe made without departing from the spirit of the present disclosure. The accompanying claims and their equivalents are intended to cover such forms or modifications as would fall within the scope and spirit of the present disclosure.

What is claimed is:

1. A substrate processing method, comprising:
   placing a substrate into a chamber, the substrate having an organic film that has been patterned over a target film;
   a diffusing a metallic element or a semiconductor element precursor into the organic film while in the chamber;
   etching a first portion of the target film by using the organic film as a mask;
   repeating the diffusing of the metallic element or the semiconductor element precursor after the etching of the first portion of the target film; and
   etching a second portion of the target film by using the organic film as the mask.

2. The substrate processing method according to claim 1, wherein the metallic element is diffused into the organic film.

3. The substrate processing method according to claim 1, wherein the organic film is a photoresist.

4. The substrate processing method according to claim 1, wherein the etching is a reactive ion etching process.

5. The substrate processing method according to claim 1, wherein the target film comprises a first-type film and a second-type film stacked on the first-type film, the first-type film and the second-type film being different materials.

6. The substrate processing method according to claim 1, further comprising:
   selecting an etch time for the etching of the first portion of the target film by monitoring an emission of light from the chamber during the etching and detecting a concentration of the metallic element or the semiconductor element precursor in a plasma within the chamber.

7. The substrate processing method according to claim 1, further comprising:
   heating the substrate during the diffusing of the metallic element or the semiconductor precursor element; and
   introducing water vapor into the chamber after the diffusing of the metallic element or the semiconductor element precursor.

8. The substrate processing method according to claim 1, wherein the target film comprises a stack of alternating silicon oxide films and tungsten films.

9. A semiconductor device fabrication method, comprising:
   forming a target film on a semiconductor substrate;
   forming and patterning an organic film on the target film;

placing the semiconductor substrate with the patterned organic film thereon into a chamber; and in the chamber, alternating a process of diffusing a metallic element or a semiconductor element into the organic film with a process of etching the target film by using the organic film as a mask.

10. The semiconductor device fabrication method according to claim 9, wherein the process of etching is a reactive ion etching process.

11. The semiconductor device fabrication method according to claim 9, wherein the metallic element is diffused in the process of diffusing, and the metallic element is aluminum that is provided from a trimethylaluminum gas.

12. The semiconductor device fabrication method according to claim 9, wherein a length of time for each process of etching is a predetermined time.

* * * * *